United States Patent [19]

Heaton

[11] Patent Number: 5,059,889
[45] Date of Patent: Oct. 22, 1991

[54] PARAMETRIC MEASUREMENT UNIT/DEVICE POWER SUPPLY FOR SEMICONDUCTOR TEST SYSTEM

[75] Inventor: Dale A. Heaton, Garland, Tex.

[73] Assignee: Texas Instruments Incorporated, Dallas, Tex.

[21] Appl. No.: 490,803

[22] Filed: Mar. 8, 1990

[51] Int. Cl.$^5$ .................................... H02M 3/335
[52] U.S. Cl. .................................... 323/285; 323/275; 323/281; 323/283
[58] Field of Search ............... 323/285, 282, 283, 275, 323/281

[56] References Cited

U.S. PATENT DOCUMENTS 4,885,674  12/1989  Varga et al. .................... 363/21

OTHER PUBLICATIONS

Luther K. Horning et al., Measurements of Quiescent Power Supply Current for CMOS ICs in Production Testing, 1987 International Test Conference, pp. 300–309.

Charles Crapuchettes, Testing CMOS $I_{DD}$ on Large Devices, 1987 Internal Test Conference, pp. 310–315.

Mike Keating & Dennis Meyer, A New Approach to Dynamic IDD Testing, 1987 International Test Conference, pp. 316–321.

*Primary Examiner*—Peter S. Wong
*Assistant Examiner*—Bruce Dunn
*Attorney, Agent, or Firm*—B. Peter Barndt; James T. Comfort; Melvin Sharp

[57] ABSTRACT

Disclosed is a device power supply in a semiconductor test system for supplying programmed test pattern voltages to a semiconductor device under test and for current range switching of current range resistors without effecting the output voltage of the device power supply.

20 Claims, 3 Drawing Sheets 5,059,889

PARAMETRIC MEASUREMENT UNIT/DEVICE POWER SUPPLY FOR SEMICONDUCTOR TEST SYSTEM

FIELD OF THE INVENTION

This invention relates to VSLI test systems and parametric measurement units within the test system and more particularly to a Parametric Measurement Unit(-PMU)/Device Power Supply (DPS) in semiconductor test equipment that can supply high currents to charge capacitive loads and measure low currents, and the PMU/DPS can be controlled by the functional test pattern generator in the test system.

BACKGROUND OF THE INVENTION

In testing CMOS devices, the measurement of quiescent currents presents several problems. One problem is the length of test time required to measure the quiescent current (IDDQ) of the power pin (VDD) for all the logic states of the CMOS device. Another problem is the long settling time associated with charging bypass-capacitance when low current ranges are used to measure leakage currents at the inputs of device under test (DUT).

The IDD quiescent current (IDDQ) of CMOS devices is measured at different logic states to determine if internal gates of the DUT have excessive leakage. Burn-in data has shown that gates with excessive leakage indicate potential reliability problems. IDDQ measurements are used to detect CMOS devices that will have premature failures.

A CMOS DUT requires a high current (50ma to 1A) during transients between logic states, but the CMOS device only requires a low current (10ua to 100ua) in a static or quiescent condition. A by-pass capacitor is also required to hold the VDD voltage stable during the high current transients between logic states.

To measure the IDDQ of a DUT. The device power supply (DPS) must be capable of rapidly switching from a high current range to a low current range and measure to 1% accuracy. Conventional DPS's take from 5ms to 100ms depending on the by-pass capacitor selected. Conventional methods of switching the current ranges opens or disrupts the voltage and/or current feedback of the DPS. This affects the output voltage of the DPS, which is also the voltage across the by-pass capacitor. The low current range resistor then has to charge the by-pass capacitor back to the programmed voltage. This causes a large time constant due to the current range selected charging the by-pass capacitor. To eliminate this long time constant, a method of switching the current ranges without affecting the output voltage of the DPS is necessary.

Prior methods do not allow the functional test generator to directly control the timing of the current range switching or analog to digital conversion or comparison triggering. Conventional methods use driver and receiver test patterns to control the IDDQ measurements. Special functional test patterns must be written when using a driver and receiver test patterns for IDDQ current range switching measurement timing. To eliminate special test patterns for IDDQ measurement, the IDDQ measurements must be supported by the functional test subsystem.

BRIEF DESCRIPTION OF THE INVENTION

The invention is to a circuit and method to implement current range switching without affecting the output voltage of the DUT Power Supply (DPS). The DPS/Parametric measurement unit (PMU) includes a closed loop voltage feedback circuit which absorbs switching transients when current ranges are changed. The output stage remains in the voltage feedback mode, unless the device under test exceeds the programmed current limit. The current monitoring circuitry does not affect the voltage feedback unless the programed current limit is exceeded.

The high gain and fast voltage response of the DPS/PMU is necessary to maintain a very small voltage error (micro-volts) across the by-pass capacitor while the voltage across the low current range is ramping to the sensed output current.

A compensation capacitor for the voltage feedback of the output stage is programmed to optimize the frequency response of the DPS/PMU, based on the by-pass capacitor selected at the DUT.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
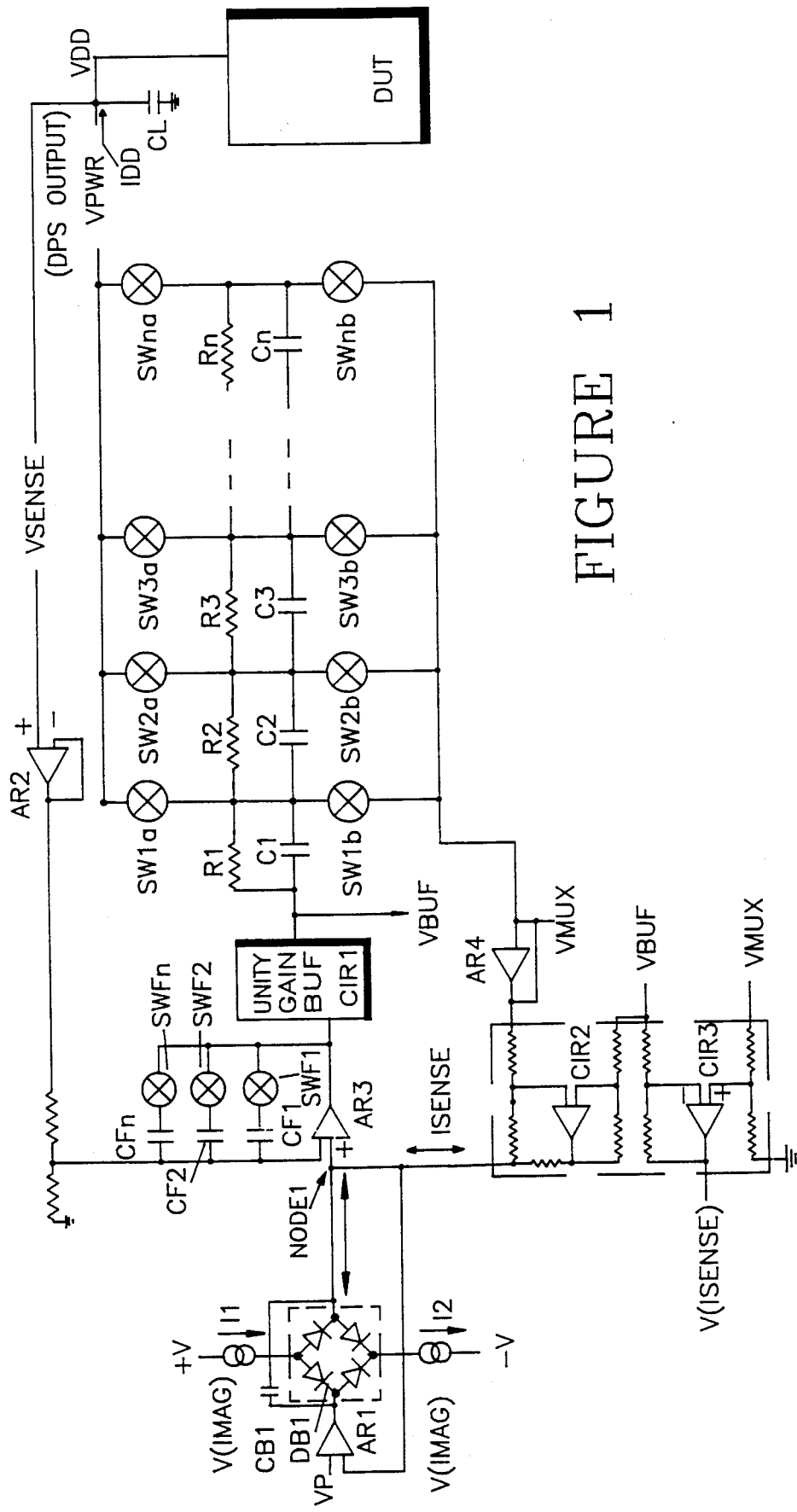
FIG. 1 is a device power supply and parametric measuring unit of the present invention

FIG. 1 is a circuit diagram of one example of a power supply for supplying the necessary test voltages and currents for a device under test. The device power supply (DPS) operates in an auto-crossover servo loop. Auto-crossover allows the DPS to be programmed as a voltage source and a current source at the same time. The DPS will be a voltage source as long as the programmed current limit is not exceeded. When the current limit is exceeded, the DPS source will sink or source the programmed current limit.

The DPS is in a voltage feedback mode to maintain the programmed voltage VP, where $VSENSE = ((VP*(RG1+RG2)/RG1)$, unless the device under test exceeds the programmed current. If the current limit is exceeded, the output voltage of the DPS will change to maintain the programmed current limit.

In FIG. 1, I1 is a voltage controlled positive current source. I2 is a voltage controlled negative current source. The voltage V(IMAG) programs the magnitude of the current limit. Resistors R1 through Rn are the current range resistors. The current limit is equal to $V(IMAG)/(ZX)$. Where ZX is equal to the programmed current range resistor (R1-Rn).

Diode bridge DB1 supplies the positive and negative current limits (I1,I2) into NODE1. The sensed current ISENSE is also connected to NODE1.

The differential voltage cross the current range resistor (R1-Rn) is converted to the current ISENSE for the current limiting feedback through Cir2. This current ISENSE can be a positive or negative current depending on the polarity of the output current of the DPS. The voltage at NODE1 will be equal to VP unless ISENSE exceeds I1 or I2. If ISENSE exceeds I1 or I2, the appropriate diodes in the diode bridge DB1 will reverse bias, and the sensed voltage of the DPS (VSENSE) will track the voltage at NODE1 based on the equation:

$$VSENSE = V(NODE1)*(RG1 + RG2)/RG1.$$

( When these diodes become reversed bias in the diode bridge DB1, the DPS converts from a voltage source to a current source, where the DPS (VPWR) will track NODE1 to maintain the programmed current limit (+/−VMAG/ZX).

Opamp AR1 corrects for any error due to the diode voltage drops in the diode bridge DB1. Capacitor CB1 is a feed forward capacitor to eliminate the current feedback ISENSE from affecting the voltage at NODE1 unless the current limit is exceeded.

Opamp AR2 buffers the sensed voltage from the device under test Vsense.

Opamp AR4 senses the DPS output voltage VPWR. The output of AR4, VMUX, minus CIR1 output, VBUF, is the differential voltage across the current range R1–Rn.

Circuit CIR1 is a unity gain buffer to increase the output current of AR3 and isolate AR3 from the low impedance load of the high current ranges.

The DPS is in a voltage feedback mode when the current ranges are switched. Since the current feedback is independent of the voltage feedback unless the current limit is exceeded, the current ranges can be switched without affecting the voltage feedback. The fast response of the voltage feed back corrects for the transients caused by the current range switching. The switching transients do not affect the output voltage (VPWR) or the voltage at the by-pass capacitor CL because these transients are absorbed by the voltage feedback.

The current range switches (SW1a–SWna) are implemented with Jfets for the high current ranges and analog switches for the low current ranges. Since the switching time of these switches (SW1a–SWna) is less than 1 microsecond, the voltage feedback will correct for the switching transients. Make before break switching from the high current ranges to low current also minimizes the switching transients.

The current range sense switches SW1b–SWnb are implemented with analog switches. Switches SW1b–SWnb sense the output voltage VPWR across the appropriate range resistors R1–Rn. The differential voltage across the range resistor is the sensed output current IDD. The differential voltage across the current range resistor is converted to a voltage V(ISENSE) relative to ground (GND) through Circuit 3 (CIR3); where V(ISENSE)=VMUX−VBUF. The sensed voltage is connected to a feedback loop by a Kelvin connection. This connection is a current connection and a potential connection. Potential drops due to stray resistance are in the current path and measurements are made in the potential path where current is almost non-existent. The output current IDD is proportional to the V(ISENSE) by the equation: IDD=-V(ISENSE)/Zx; where Zx is the programmed current range resistor (R1–Rn).

The programmed current range impedance can also be purely capacitive (ZX=CX) for the IDDQ ranges. In this case the output current IDD would be IDD=-V(ISENSE)*(CX/T3). A capacitive current range impedance would integrate the output current over the specified time T3, since the differential voltage V(ISENSE) is a linear ramp based on the output current IDD. The settling times of the OPAMPS do not affect the measurement accuracy. This will allow comparisons to be done at a much faster rate.

The voltage V(ISENSE) can be read through an analog to digital converter or compared to a high and low voltage limit through a window comparator.

The compensation capacitors (C1–Cn) across the range resistors are chosen to match the frequency response of the DPS. The compensation capacitors (CF1–CFn) are programmable through the analog switches (SWF1–SWFn) to match the by-pass capacitor CL selected at the device under test (DUT).

The implementation of the IDDQ DPS can also be applied to low current measurements of parametric measurement unit (PMU). When low current ranges are used to measure leakage on the inputs of devices, long settling times are required due to the low current range charging the distributed capacitance of the interconnection from the PMU to the DUT. This distributed capacitance can be as high as 3000pf. The settling times can be from 5 to 100ms, depending on the current range selected.

Conventional PMU(s) use line charge circuitry to charge the distributed capacitance close to the programmed voltage, but the PMU current does not settle until the output voltage settles to the exact programmed voltage. The output voltage settling time is still dependent on the distributed capacitance and low current range programmed.

By implementing the IDDQ current range switching in the PMU, a high current range can be selected until the current to the DUT settles. Then the low current range can be switched in without affecting the output voltage of the PMU. The total test time of this method would be less than 0.5ms In order to make IDDQ measurements at predetermined DUT states, the measurements need to be synchronized with the device stimulus which are produced by the functional test pattern generator in the test system. Selected test patterns can be used to trigger a programmable IDDQ timing window used to invoke IDDQ measurements on the DPS. The IDDQ window can switch the current ranges and trigger an analog to digital conversion or comparison synchronized to the test pattern.

Figure 2:
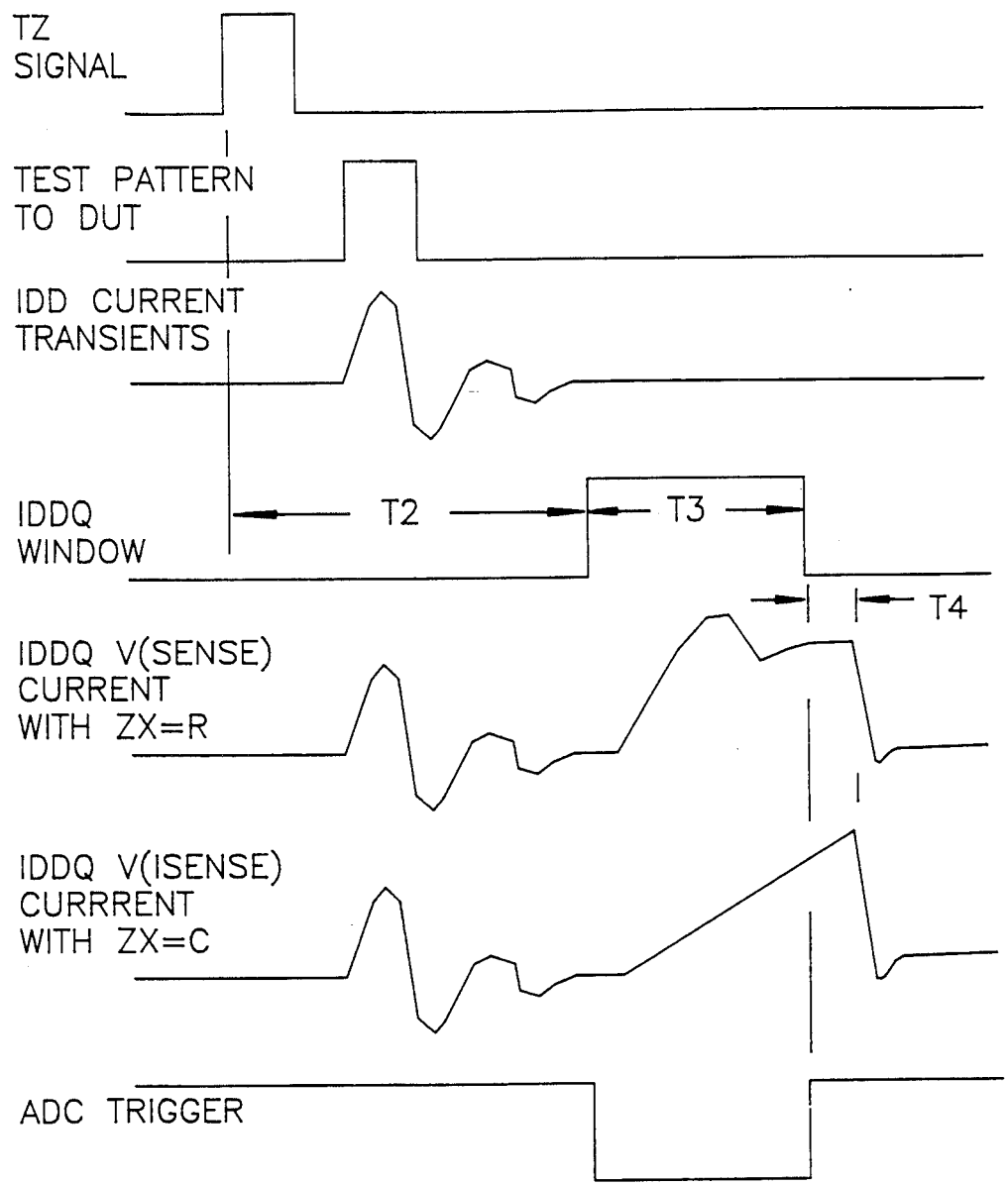
FIG. 2 illustrates IDDQ Window Timing.

Referring to FIG. 2, the rising edge of the IDDQ window will switch the DPS from a normal current range to a IDDQ current range by a programmable time from TZ. This programmable time interval T2 allows the IDD switching transients of the DUT to settle after the DUT test pattern has been applied to the DUT. After the DPS has been switched to the low current range at T2, the time interval T3 allows the DPS V(ISENSE) to ramp to the sensed current and settle for a resistive IDDQ current range impedance. For a capacitive IDDQ current range impedance, the time interval T3 is the integration time of the IDDQ measurement. The falling edge of the IDDQ window triggers the analog to digital conversion or comparison at (T2+T3). The falling edge of the IDDQ window also changes the DPS back to the normal current range. T4 is a nominal delay in the hardware to allow analogto-digital conversion before the DPS is returned to the normal current range.

Figure 3:
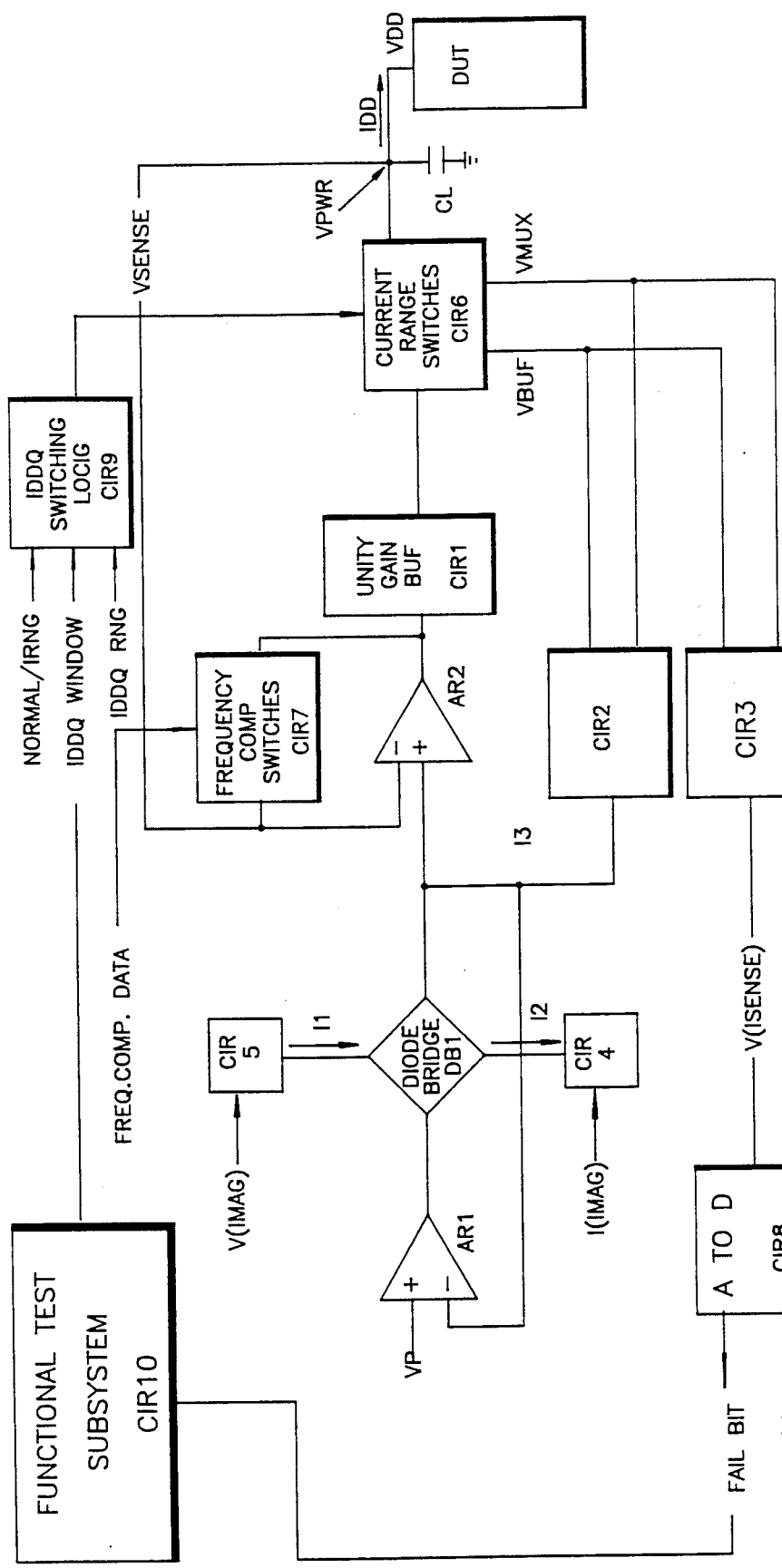
FIG. 3 is a block diagram of the Device Power Supply showing inputs and outputs of the power supply.

FIG. 3 is a block diagram of the DPS of FIG. 1 showing external connections. The NORMAL I RNG, IDDQ RNG and FREQ COMP DATA. are static logic levels that are set-up before the device under test stimulus pattern execution begins. The normal I RNG is programmed based on the maximum current transients expected at the DUT. The IDDQ RNG is programmed based on the maximum current to be measured with the DUT in the Quiescent State. The Frequency Compensation Data is programmed based on the by-pass capacitor selected at the DUT.

The functional test subsystem, CIR 10, supplies the signal IDDQ window to the device power supply synchronous with the device under test stimulus. On the rising edge of the IDDQ window, the IDDQ switching logic circuit CIR9 switches from the NORMAL I RNG to the IDDQ I RNG. The output of CIR9 switches the current ranges in CIR6. The falling edge of the WINDOW IDDQ triggers an analog to digital conversion, ADC DATA, or triggers a high and low window comparison in CIR8. The output of the comparison, FAIL BIT, sends a FAIL FLAG back to the function test subsystem. The falling edge of IDDQ WINDOW also switches CIR9 output back to the NORMAL I RNG.

What is claimed:

1. A device power supply in a semiconductor test system for supplying programmed voltages to a semiconductor device under test and for current range switching of a current range impedance without affecting the output voltage of the device power supply, including:
   a closed loop voltage feedback circuit to maintain at the device under test the programmed voltage;
   a closed loop current feedback circuit, the input of which is across the current range impedance, said current feedback circuit functioning independent of the closed loop voltage feedback circuit; and
   a plurality of current range switched connected inside the closed loop voltage feedback circuit.

2. The device power supply according to claim 1, including a compensation capacitor, the value of which is programmed to optimize frequency response at the output circuit based on the capacitive load at the output.

3. The device power supply according to claim 1, where the device power supply circuit operates in an auto-crossover servo loop, allowing the power supply to be programmed as a voltage source and a current source at the same time.

4. The device power supply according to claim 3, wherein the device power supply functions as a voltage source as long as a programmed current limit is not exceeded.

5. The device power supply according to claim 4, wherein the device power supply sources or sinks the programmed current limit when the current limit is exceeded.

6. The device power supply according to claim 3, wherein the output voltage of the device power supply changes to maintain the programmed current limit.

7. The device power supply according to claim 1, wherein the device power supply includes a voltage controlled positive current source and a voltage controlled negative current source.

8. The device power supply according to claim 7, wherein a diode bridge supplies positive and negative current limits.

9. The device power supply according to claim 1, wherein the current range switches have high current ranges and low current ranges.

10. The device power supply according to claim 9, wherein the current range switches are implemented with make before break switches for switching from high to low current ranges and implemented with analog switches for the low current range.

11. A device power supply in a semiconductor test system for current range switching without affecting the output voltage of the device power supply, comprising:
    an auto-crossover power supply circuit
    an output circuit for supplying voltage to a device under test;
    a closed loop voltage feedback circuit for sensing and maintaining the voltage applied to the device under test;
    a current monitoring circuit for regulating the voltage feedback circuit when a programmed current limit is exceeded and that operates independently from the voltage feedback circuit; and
    current range switches in the closed loop voltage feedback circuit.

12. The device power supply circuit according to claim 11, wherein the closed loop voltage feedback circuit is Kelvin connected to the power supply load.

13. In a device power supply in a semiconductor test system for supplying programmed voltages to a semiconductor device under test and for current range switching without effecting the output voltage of the device power supply, a method of switching current ranges without affecting the voltage applied to the device under test, including the steps of:
    sensing the programmed voltage applied to a pin of the device under test;
    applying the sensed voltage to a feedback loop;
    comparing the sensed voltage with a desired value;
    sensing current across a range resistor with a current feedback loop; and
    switching current range switches to adjust a current range based on a maximum current to the device under test.

14. The method according to claim 13, wherein the sensed voltage is connected to the feedback loop by a Kelvin connection.

15. The method according to claim 13, wherein a signal generated by a functional test pattern generator switches the current range switches synchronous with a test pattern generated by a functional test pattern generator.

16. The method according to claim 15, wherein the signal generated by the functional test pattern triggers an analog to digital conversion synchronous with test pattern timing.

17. The method according to claim 15, including the step of generating a timing window during which the current range switches are switched.

18. The method according to claim 15, wherein the current range switches are switched in order to measure current between functional test pattern changes.

19. The method according to claim 13, wherein the switching current range impedance define a differential voltage which is converted by an analog to digital converter to a fail bit.

20. The device power supply circuit according to claim 1, wherein the device power supply circuit is used as a parametric measuring unit for measuring voltage at the inputs and outputs of a device under test.

* * * * *